June 29, 1971 L. KASTNER 3,589,003

VOLTAGE AMPLIFIER PROCESS

Filed Jan. 19, 1968 4 Sheets-Sheet 1

INVENTOR.
LEDYARD KASTNER

BY Jerome Bauer

ATTORNEY

June 29, 1971 L. KASTNER 3,589,003

VOLTAGE AMPLIFIER PROCESS

Filed Jan. 19, 1968 4 Sheets-Sheet 2

INVENTOR.
LEDYARD KASTNER
BY Jerome Bauer
ATTORNEY

June 29, 1971 L. KASTNER 3,589,003

VOLTAGE AMPLIFIER PROCESS

Filed Jan. 19, 1968 4 Sheets-Sheet 3

INVENTOR
LEDYARD KASTNER
BY Jerome P. Bauer
ATTORNEY

VOLTAGE AMPLIFIER PROCESS

Filed Jan. 19, 1968 4 Sheets-Sheet 4

INVENTOR.
LEDYARD KASTNER

BY

ATTORNEY

United States Patent Office 3,589,003

Patented June 29, 1971

3,589,003

VOLTAGE AMPLIFIER PROCESS

Ledyard Kastner, 3579 Merrick Road, Seaford, N.Y. 11783

Filed Jan. 19, 1968, Ser. No. 699,100
Int. Cl. H01b 69/02
U.S. Cl. 29—624R 7 Claims

ABSTRACT OF THE DISCLOSURE

A process of making a voltage amplifier by providing two spaced multicondenser stacks and disposing rectifier elements in said space with the leads bonded in series with various of the condenser plates.

The present invention relates to a voltage amplifier and power supply and to the method of making the same.

Voltage amplifiers composed of condenser and diode units connected in series to an AC supply so as to produce a series of resultant DC voltage outputs have been employed in a number of power supply systems and are well known. Such units theoretically should result in a voltage doubling or multiplying in ratio to the position of the output along the series and taking into consideration the series resistance losses of its capacitors, consequently are desirable because of their small size and relative economy in areas where there is only a single fixed power supply.

It has been found, however, that, theory aside, such devices are less than highly efficient and that they are generally poorly regulated and unstable at the high voltage ranges.

Voltage amplifiers at present are generally made from highly reliable and rugged components. However, it has been found that present methods of producing these amplifiers drastically destroy efficiency, ruggedness and reliability. All components are electrically modified and varied upon the application of heat when soldered into a circuit or manipulated under heat or mechanical handling. Because of this, it has been virtually impossible to fabricate voltage amplifiers in which the exact amplification can be precalculated and engineered precisely.

It is the objective of this invention to provide a voltage amplifier which is highly reliable, efficient and precise in operation through a wide range of voltages.

It is another objective of this invention to produce a solderless voltage amplifier.

It is an object of this invention to provide a unitary monolithic construction for a voltage amplifier in which the various components may be preformed and encased in a fixed housing.

It is still another objective to provide a device which being high in both theoretical and practical efficiency can be precalulated and set to provide accurate operation even under the most adverse operation by unskilled operators.

It is also an objective to produce a device which is rugged and reliable and will meet the most exacting of specifications including those for the military.

It is yet another objective of this invention to provide a novel method and process for forming voltage amplifiers of the type herein described.

It is yet a further objective to provide a method in which such amplifiers are formed with a minimum amount of heat employed in the process.

These and other objectives, advantages and novel procedures will be apparent from the following description of the preferred form of the device and the preferred method of making the same. The description refers to the attached drawings in which.

Figure 5:
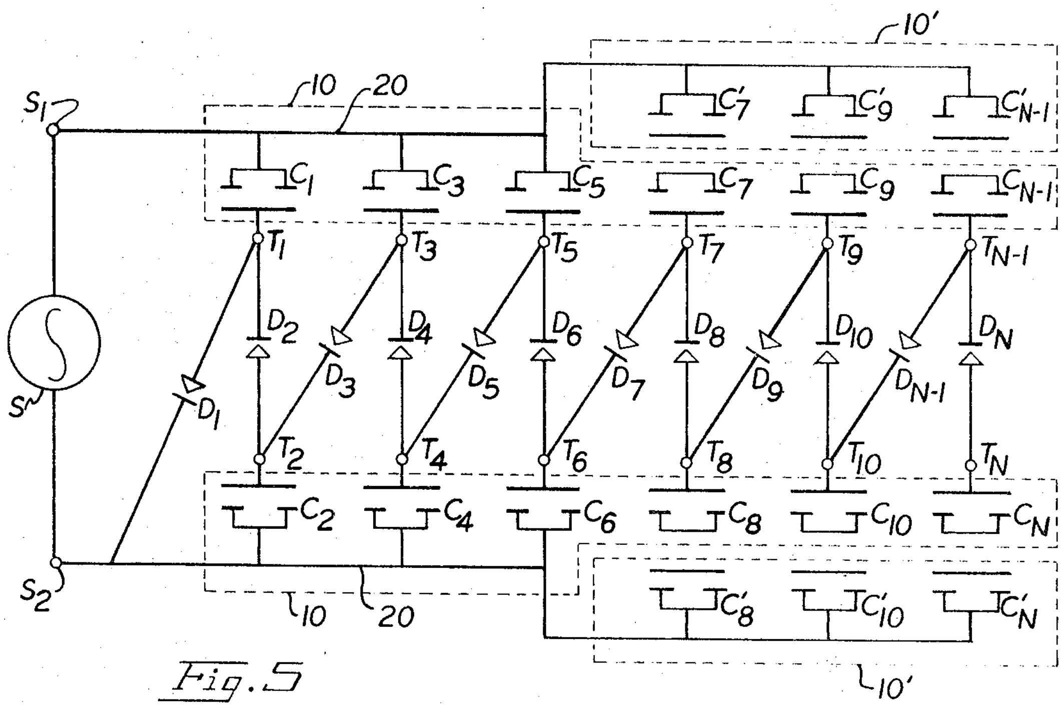
Figure 6:
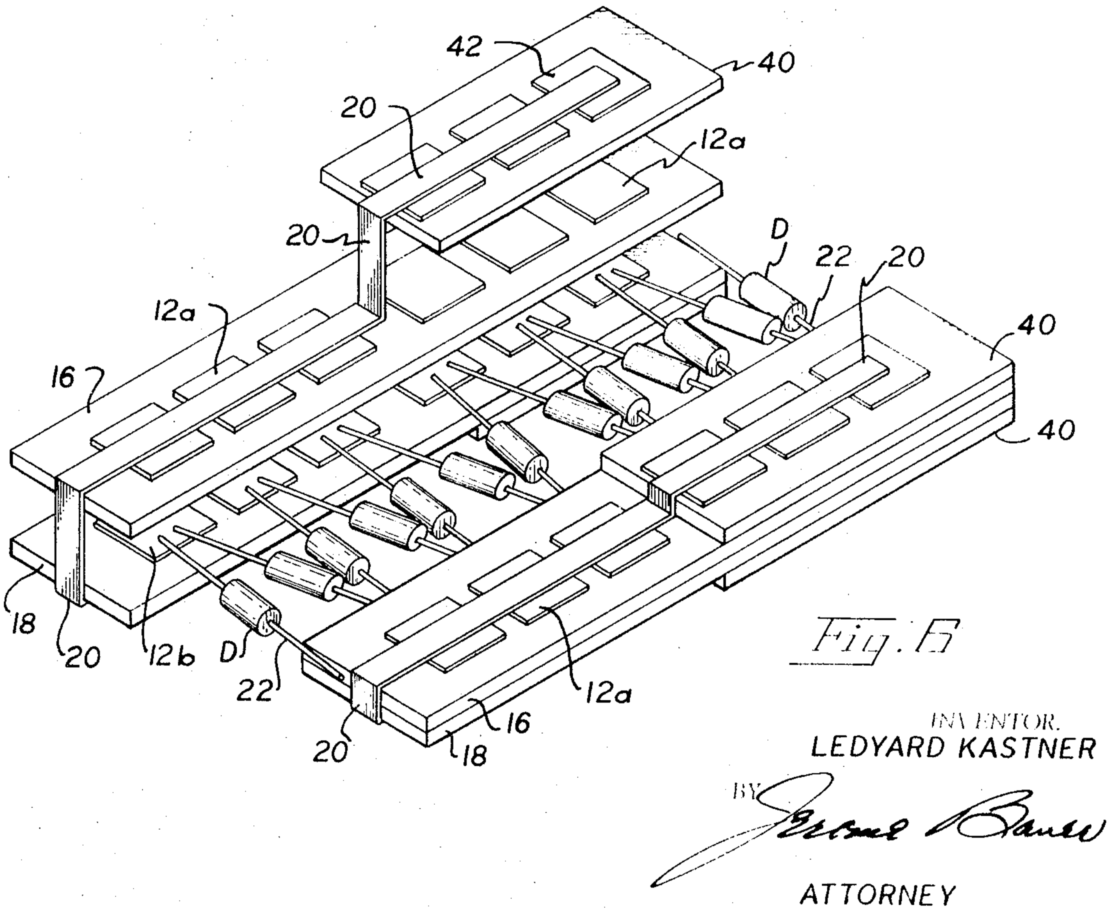

FIGS. 4I through VIII are schematic representations of the steps involved in the process of fabricating the structures of the present invention and end views of the structure in development;

FIG. 5 is a diagrammatical representation of a modified form of the structure of the present invention showing its adaption for use with ultra-high voltages; and FIG. 6 is an exploded view of the structure of the modified device.

Figure 1:
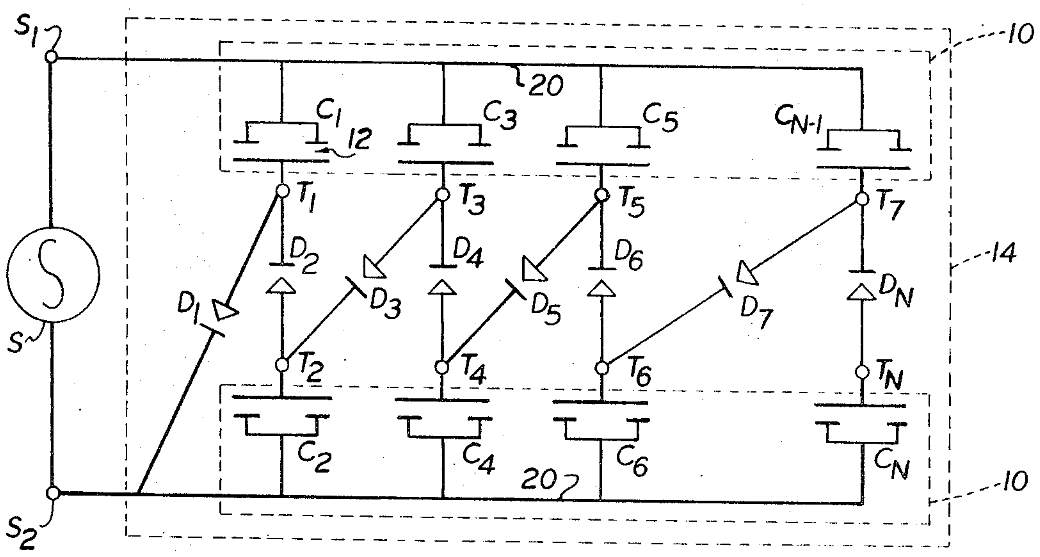
FIG. 1 is a diagrammatic representation of a voltage amplifier employing the principles of the present invention.

The device of the present invention, diagrammatically depicted in FIG. 1, comprises a chain of diodes or other unidirectional rectifying means $D_1$, $D_2$ . . . $D_N$ each connected in series with condenser stages $C_1$, $C_2$ . . . $C_N$ and an alternating current source S. A plurality of terminals $T_1$, $T_2$ . . . $T_N$ may be provided across the individual condenser assemblies as are terminals $S_1$ and $S_2$ for connection to the source S. Alternate condensers such as $C_1$, $C_3$ . . . $C_{N-1}$ and $C_2$, $C_4$ . . . $C_N$ are combined, in a manner thereinafter described, into a novel unitary monolithic block assembly 10 wherein each condenser is provided with dual capacitor plate elements 12 and the whole is thereafter encapsulated with connecting diodes D into a permanent housing 14.

Figure 2:
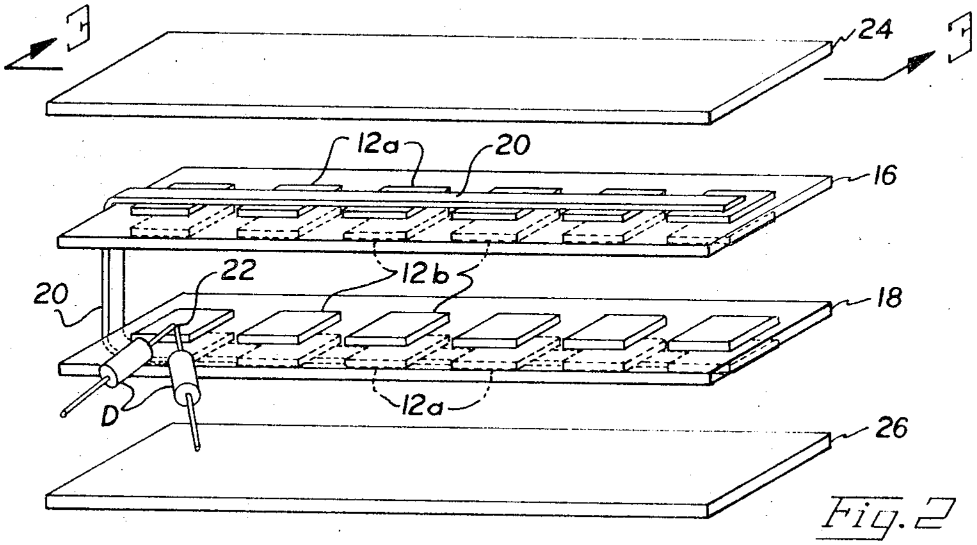
FIG. 2 is an exploded view of a condenser block form in accordance with the present invention.
Figure 3:
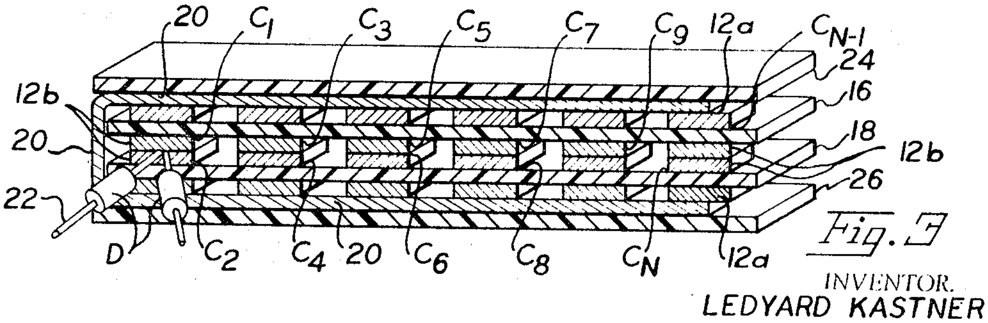
FIG. 3 is a sectional view of the condenser block as assembled, taken along line 3—3 of FIG. 2.

Turning now to FIGS. 2 and 3, the condenser block assembly 10 is formed of a pair of flat dielectric or nonconductive substrates 16 and 18, having opposed planar surfaces. The dielectric substrates 16 and 18 are shown as flat and rectangular in configuration; however, it will be appreciated that other geometric shapes such as ovals, polygons, etc., both planar and curved, may be employed provided, as will be seen, that each substrate has at least a pair of opposed parallel surfaces. The outer surface of dielectric member 16 and the lower surface of dielectric member 18 are provided with a plurality of evenly spaced waferlike electrodes **12*a*. The inner faces of substrates 16 and 18 are also provided with correspondingly spaced and oriented wafer electrodes 12*b* which form in combination with the electrodes 12*a* a series of individual capacitor units on each of the dielectric substrates. The wafers may be silver, copper or other highly conductive material in accordance with the electrical properties desired. The electrodes 12*a* and 12*b* are preferably deposited in a thin film on the members 16 and 18 which are then placed in face-to-face abutment, with their inner electrodes 12*b* contiguous, thereby forming a progressive series of transversely aligned condenser stages. Running along the outside of the dielectric substrate members 16 and 18 and in contact with each of the exposed electrodes 12*a* is a ground connection 20 of conductive material, which electrically connects each of the exposed electrodes 12*a* converting each pair of apparently separate capacitor units into a single condenser stage C having as one condenser plate the common electrodes 12*b* and as the other condenser plate dual electrodes 12*a* on either side of the common electrode. By this construction, it will be appreciated that the capacitance or current bearing ability of each condenser stage C is in effect doubled without really increasing the physical dimensions of the electrodes or condenser plates but only slightly increasing the depth of the condenser block 10**.

Sandwiched or otherwise secured between the coinciding electrodes **12*b* of the abutting dielectric plates 16 and 18 are the leads 22** from one or more of the diodes D or T terminals T so that in toto the series of capacitor units form operating condensers such as those shown in FIG. 1.

The condenser block assembly 10 is completed by securing to the exposed upper and lower surfaces of the substrates 16 and 18 a top insulating plate 24 and a bottom insulating plate 26 also of dielectric material and encasing the unit in plastic, ceramic or other dielectric material.

After completing the block assembly 10, a pair thereof are combined with diode and terminal connections in accordance with the arrangement shown in FIG. 1 to provide a complete voltage amplifying device having the chain of diodes D and the connected condenser $C_1$–$C_N$. The voltage amplifying device is thereupon itself encased in the housing 14 which may be plastic, ceramic or other insulating material to provide a monolithic structure. It is to be appreciated that a critical factor in the present invention resides not only in the structure of the condenser block assembly 10 but also in its method of fabrication. This method will be described more fully hereinafter.

Returning to FIG. 1, the operation of the device follows conventional parallel electrical circuit application. Tapping the amplifier across the first diode $D_1$ and first condenser assembly $C_1$, at terminals $S_1$ and $T_1$, will, for obvious reasons, result in no multiplying benefit at all, although the current passes in series through condenser $C_1$ and diode $D_1$. However, tapping across terminals $S_2$ and $T_2$ will result in voltage multiplication since the circuit formed by shunting the second condenser $C_2$ in series with the diode $D_2$ across condenser $C_1$ adds the potential of condenser $C_1$ to that of condenser $C_2$. This occurs because the current from source S, during one-half cycle, charges the condenser $C_1$ to peak voltage and during the other half builds on condenser $C_1$ to charge condenser $C_2$ to twice the peak voltage of the source.

Except for the virtually negligible amount of internal resistance resulting from the employment of terminal connections, etc., the voltage amplification is exactly the multiple of condenser stages employed. Consequently, by adding a third diode $D_3$ and a serially connected condenser $C_3$ across the terminals $S_2$ and $T_2$ a potential across terminals $S_1$ and $T_3$ (i.e., across the third condenser $C_3$) of substantially three times the voltage of the source S is obtained. Similarly, by the addition of a fourth set of diodes $D_4$ and condenser $C_4$, a voltage four times that of the source is obtained at terminals $S_2$ and $T_4$. The voltage of the source S may be thus increased as desired by the addition of an N number of diodes and condenser stages as illustrated so that amplification N times that of the source is obtained.

Numerous advantages accure from this particular arrangement. Amplification of a given source voltage to any multiple is obtainable since taps may be easily made at any one of the particular terminals. There is no practical or theoretical limit to the number of diode and condenser stages that may be employed. The resultant amplification is most efficient since loss of voltage and/or current is almost negligible and of little consequence due to the common terminal connections and absence of internal resistance. Above all, a simple, rugged, solderless amplifier is obtained having efficient and precise operating characteristics.

Having described the structure and operation of the voltage amplifier, it will now be appreciated that numerous methods may be employed to obtain the novel unitary and monolithic condenser block which is at the heart of the present invention. However, it will be equally well appreciated that the electrical characteristics, life expectancy and operating efficiency of condensers are directly dependent on the quantity and quality of the materials used and their handling during manufacture. A change or a modification, no matter how small, in any one factor will have an effect of producing a condenser varying not only from the engineered design but also from every other condenser, even though similar in appearance. Since the present invention has as its purpose the production of a reliable, precise and efficient voltage amplifier, there has been developed a novel method of producing condenser blocks with uniform capacitor stages.

Figure 4:
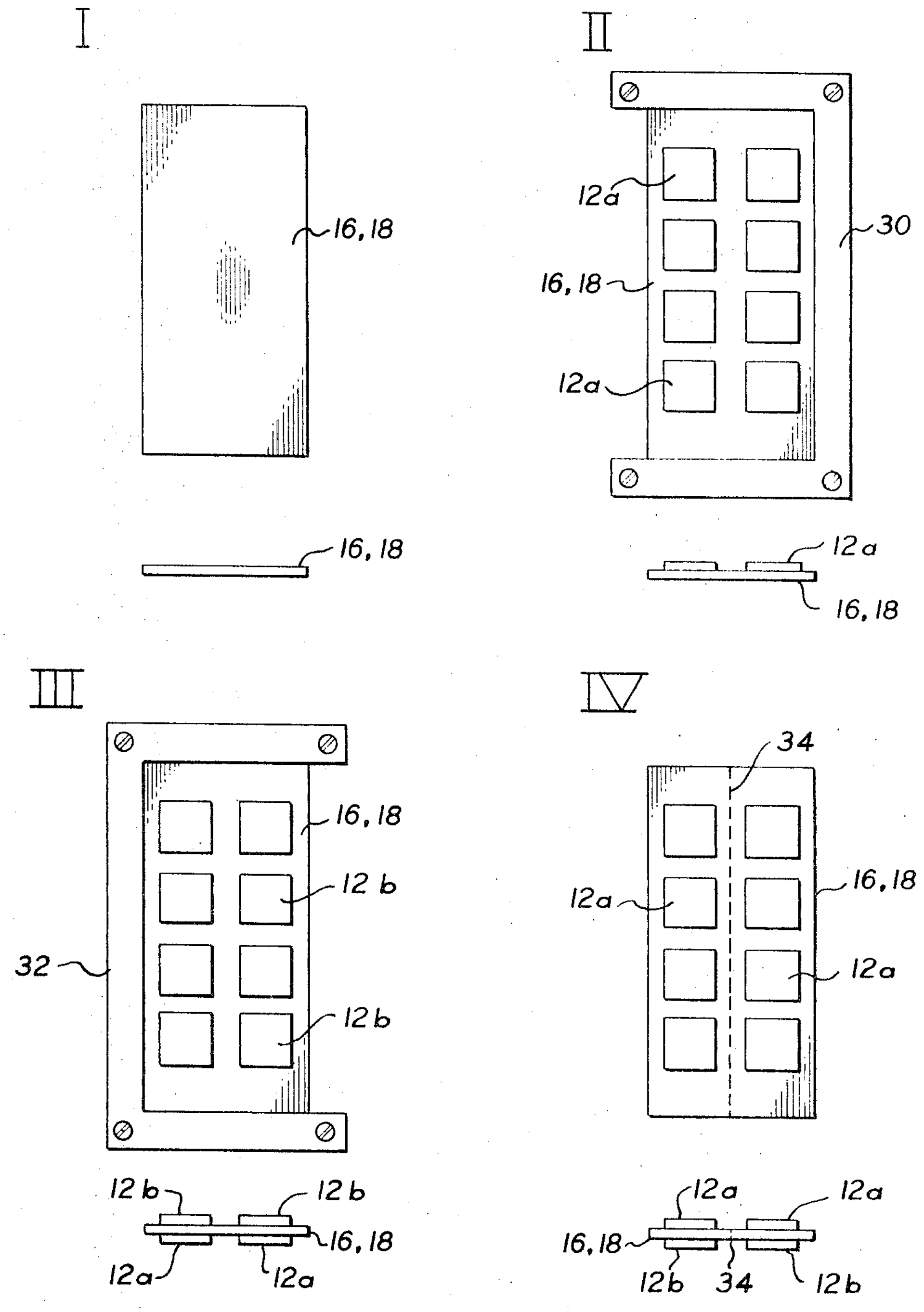
Figure 4:
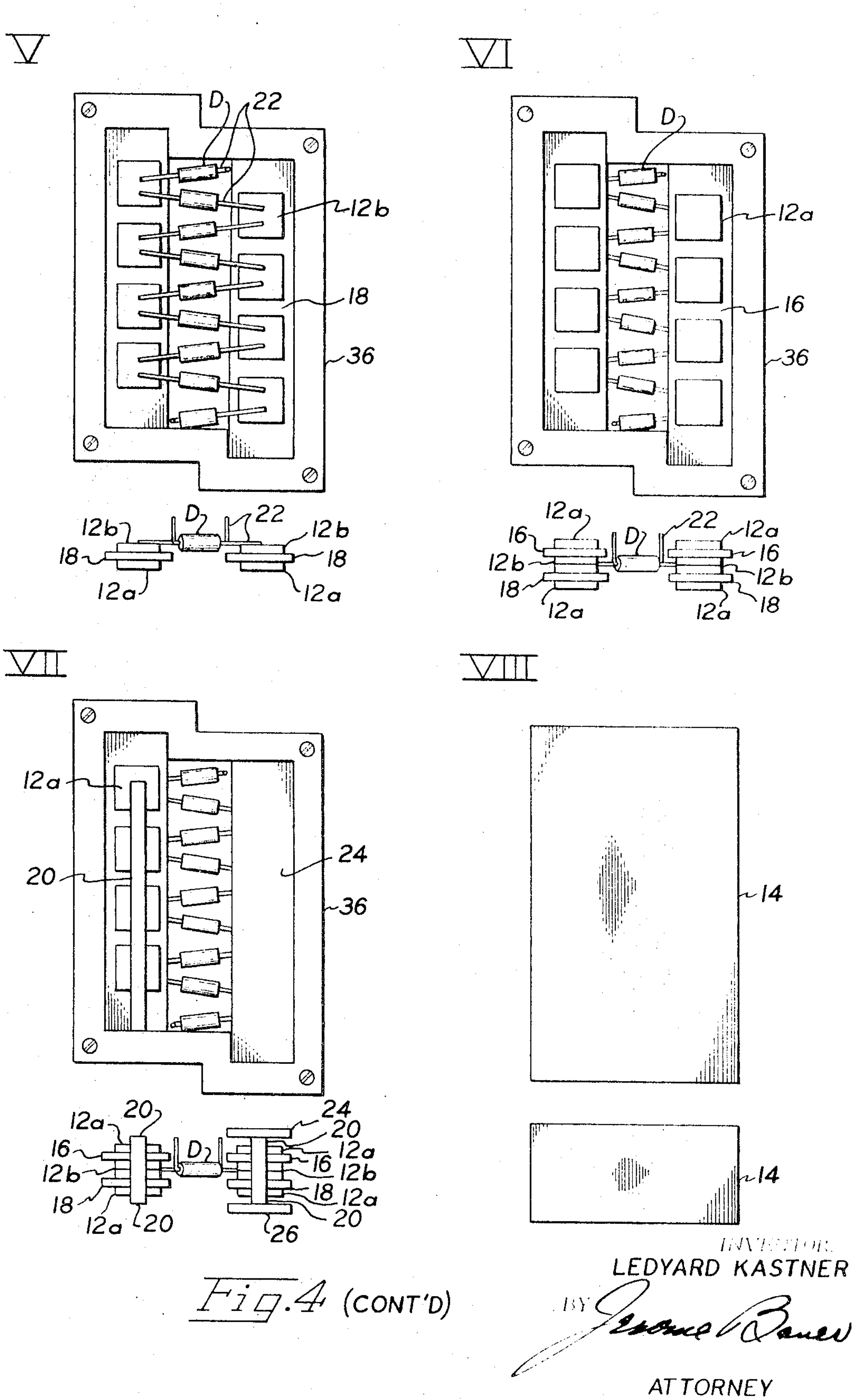

The method is diagrammatically depicted in FIG. 4 in which like reference numerals are used for parts similar to those described in FIGS. 1–3. In FIG. 4, the method is shown in block diagram form depicting the growth of the device in various stages. An end view of the device corresponding to its stage of development is also shown. The first step (Step 1) is the choosing and sizing of a suitable dielectric substrate. Preferably, a thermoplastic material which is nonconductive, has stable and constant dielectric characteristics, and is capable of having electrode material easily adhered to it. The dielectric material is carefully sized and cut to the length of the desired substrate 16 or 18 but to twice the width so that a pair thereof may be made simultaneously. The substrate 16 is, of course, rectangular and has opposed planar surfaces, as preferred, although other uniform shapes may be employed.

In the second step, the plate 16 is located carefully and precisely in a jig 30 or other holding tool of a suitable silk screening device. The screening device may be of any conventional construction and form. By the silk screen process a plurality of electrode plates 12*a* is deposited upon the upper surface of dielectric substrate. The electrode plates 12*a* are preferably a conductive silver paint although copper, platinum or other metals may be employed. The electrode plates 12*a* are deposited in uniform, spaced and evenly oriented fashion in two spaced rows running the length of the dielectric substrate. The silk screening process is eminently suited to deposit thin films in the manner described in perfect repetitive precession and is therefore to be preferred. Other processes, however, such as etching or printing, or vacuum depositing may be used if proper care is given to the registration of the film deposition and other similarly critical factors.

After depositing the plates 12, the dielectric substrate is in Step 3 turned over and similarly silk screened in a second jig 32 on its reverse side with the corresponding electrode plates so as to now form a capacitor sub-unit. Since accurate registration may be maintained easily in the silk screening process, the electrode plates 12*b*, on the reverse side, are precisely oriented with each other.

In Step 4, the deposited electrode plates 12*a* and 12*b* are hardened and the dielectric substrate 16 (18) cut in half along its longitudinal axes 34 so as to provide two exact duplicate capacitor strips. The hardening of the metallic electrode plates may be made under the low heat and under atmospherically controlled conditions, although it may be preferred to merely allow the assembly to dry at ambient conditions for a period of time.

The pair of multi-capacitor assemblies are then transferred to another jig or holding stool 36, Step 5, and laid flat edge-to-edge on their upper or outerface. The capacitor assemblies are offset or stepped from each other longitudinally so that, except for the end electrode plates, the plates of one assembly are midway between the plates of the other assembly. Thereafter, the required number and type of diodes are placed or merely laid on and between the opposed plates in the manner suggested by the arrangement depicted in FIG. 1. The required number of terminal leads 22 are also placed upon the appropriate plates. It will be observed that placing the assembly again in a jig insures continued registration and accuracy in fabrication and by offsetting opposed assemblies, it is possible to lay the leads in their proper positions without bending or distorting them in any manner.

After setting the diodes D and leads 22 in position, a second layer of capacitor assemblies are placed over the leads (6th step). Before doing so, however, a thin layer of resin or buttering agent is spread over the mating faces of the capacitor assemblies. The resin or buttering agent acts to soften the metallic electrode plates so that the metal film tends to flow somewhat under pressure. Thus, when the second layer capacitor assembly is placed over the first layer containing the diode leads, etc., the metal completely blends together flowing to surround the leads to make a unitary compact common electrode in which the leads 22 are securely gripped without affecting the dielectric characteristics of the layers or leads. In this manner, it is unnecessary to solder, weld or otherwise join the diode leads to the capacitor plate. Thus, what may be termed a solderless connection and ultimately a solderless amplifier is constructed. The joined assembly is again permitted to harden. Since the silk screening steps were performed under utmost uniformity and precision, the second capacitor layer will match and orient perfectly with the first capacitor layer.

In the 7th step, the hardened assembly of capacitor unit is removed from the jig 34 and the common ground connection 20 for the exposed capacitor plates are placed about the capacitor units joining plates 22*a*. Preferably, the grounding connections are of the same metallic material as the condenser plates and are placed longitudinally in position and applied with the resin or buttering compound so as to insure secure contact. In practice it has been found that the connections 20 need not be applied as separate strips but may be continuing connections of and between the condenser plates to connect them together electrically. The condenser stages are at this point operatively complete. The top and bottom cover plate 24 and 26 is applied to cover the exposed capacitor plates and the ground connection. Additional terminal leads, if required, may be applied in this step.

In the 8th and last step, the entire assembly is placed in a mold and encapsulated in a thermoplastic resin of the type used to make the dielectric substrate. Encapsulation may also be accomplished together with potting in epoxy resin, potting compounds or high voltage waxes of the type common in the manufacture of conventional condensers. Upon encapsulation, a single monolithic unitary structure is obtained which satisfies each of the objectives and advantages enumerated previously and which conform precisely to the electric circuitry described in connection with FIG. 1. Such devices of relatively small physical dimensions, generally not exceeding 1 x 6 inches in area with comparatively small condenser plates are capable of handling anything from 1 kv. to in excess of 75 kv. in potential. Because of the solderless construction, shorting, bypassing and unnecessary condenser termination is avoided. Because of the precision and accuracy of fabrication, reliability and precise performance are obtainable unit after unit.

It will be of course appreciated that one or more of the steps may be omitted or combined in the event further economy of time and material is desired. For example, in Step 7, the covering of the exposed capacitor plates by covers 24 or 26 may be omitted since in Step 8, the entire unit is encapsulated, in any event. Other modifications will be just as easily apparent to those in the art.

It is, of course, apparent, that no matter how large one makes a condenser unit, it has a certain critical voltage beyond which it breaks down. This is, of course, the case with the present structure. However, the present invention has an advantage, in that, it permits of a simple modification which will allow operation under extraordinary voltages. It is well known that by placing condenser units in series, the voltage across any one condenser is only a portion of the sum across the total number of condensers. Accordingly, provision is easily made to modify the basic structure of this device so as to build on to the higher stages successive series of condenser assemblies to thereby lower the voltage across any one condenser unit. While certain small loss in capacitance results from series connected condensers, the prime objective of voltage amplification is still efficiently obtained.

This modification is diagrammatically depicted in FIG. 5 wherein the basic structure of a chain of diodes $D_1$ to $D_N$ and connected condenser stages $C_1$ to $C_N$ are shown. The number of stages have been increased in this figure to show higher voltage multiplication but otherwise is basically the same in structure and operation to the arrangement shown in FIGS. 1, 2 and 3. To increase the voltage capacity of the higher stages $C_1$ to $C_N$ each of the condenser stages are backed with a corresponding condenser stages $C_{7'}$ to $C_{N'}$ so that, as an example, the potential free terminals $S_2$ and $T_8$ across condensers $C_8$ and $C_{8'}$ is the sum of the potential across the two condensers individually. Since, as will be explained later, the structure is such that the condensers $C_8$ and $C_{8'}$ will match and be substantially equal in operating characteristics, the potential across each condenser $C_8$ and $C_{8'}$ will be half of the total potential. Thus, twice the voltage can be made to "pass" between terminals $T_8$ and $S_2$ than would have been able to pass if on one condenser, i.e., $C_8$ was employed. Similarly, in each of stages $C_7$–$C_{7'}$ to $C_N$–$C_{N'}$, the working voltage is made to double. This working voltage does not however increase the voltage amplification characteristics of the respective stage. This characteristic remains constant because serially connected condensers do not build upon each other but act, so to speak, in unison. Accordingly, at the eighth stage, only 8 times amplification is obtained and at the 9th stage 9 times amplification is obtained in the manner described previously.

FIG. 6 shows how this modification is structurally accomplished in a device having a curved configuration. Capacitor assembly units 10, including electrode plates 12*a* and 12*b*, assembled with interconnecting diodes D are formed as per the steps one through six of the preferred method previously described, it being easily appreciated that the described method can be modified to employ jigs, etc. for curved surfaces. The common ground connection for the exposed diodes is for the interim omitted from the construction. A small capacitor layer 40 including capacitor plates 42, also fabricated exactly in accordance with steps 1–4 of the preferred method is applied directly on to the exposed or outer surfaces of the capacitor assemblies so that the plate 42 orients with and mates with the plates 12*a*. Suitable epoxy resins or buttering agents are employed to secure the layer 40 to the capacitor units and to blend the metal of plates 42 and 12*a* together. The plate 40 is of such length and has only so many capacitor plates 42 as are required to form the additional condenser stages C at the high end of the amplifier block 10 and in combination forms individual series connected condenser assemblies. Each stage is thus increased in working voltage without using contact leads, solder joints, etc. which might adversely effect performance. More than one additional layer may be applied to further cut the operating voltage and in fact it may be preferred to pyramid layers on successively higher stages as emplification proceeds. Of course, such pyramiding too has its practical limits since excessive series connections of condensers will result in the lowering of capacitance to such a point where operation ceases.

After applying the additional layer 42, the unit is completed by attaching the common ground connection 20 between outside plates 42 and 12*a* of the lower stages and thereafter encapsulating the unit, all in the manner previously described.

Thus, the present invention provides a novel structure which is compact, rugged and easily used. It is highly efficient and adaptable for use in both high and low voltage applications. It is also pre-calcuable and capable of being closely engineered to desired specifications.

It is clear that various changes and modifications can be made to both the structure and the method without departing from the essence of the invention described. For example, the dielectric material may be in any shape as noted and of a variety of material. The diodes may be replaced by other suitable rectifiers including solid state devices. Accordingly, it is intended that the present description be by way of illustration only and that the scope of this invention be limited only by the appended claims.

I claim:

1. A method of assembling a voltage multiplier comprising the steps of creating a plurality of dielectric substrates having a pair of opposed surfaces on which are deposited a plurality of conductive capacitive elements, positioning pairs of said substrates in face to face abutment to receive the lead of a lead containing rectifier therebetween and so forming two multi-condenser units with each spaced from the other, positioning the bodies of lead containing rectifiers in the space between said two units and bonding the leads thereof in series between and in direct electrical connection with abutting conductive capacitive elements of corresponding condensers of and between each one of the spaced two multi-condenser units, directly electrically interconnecting by bonding a common conductive strip to all the non-abutting conductive capacitive elements of each of said two multi-condenser units and, applying terminal leads to said condensers and the lead of said rectifiers for connection to a source of current and to a load to thereby create a voltage multiplier having a plurality of parallel circuits connected to said source, each of said circuits comprising a series connection of rectifier and condenser.

2. A method of assembling a voltgae multiplier comprising the successive steps of choosing and sizing a plurality of dielectric substrates having opposed faces, depositing a selected number of capacitive plates in spaced orientation on both faces of each of said substrates to produce a plurality of identical multi-condenser units, positioning a pair of said units in spaced edge-to-edge relationship to receive lead containing rectifier means therebetween, placing plural rectifier means in the spaces between the edges of the units with the leads of each rectifier means in series between corresponding condensers of the units, covering and affixing to each of said units another of said units so as to sandwich said leads between the respective adjacent plates of said units, interconnecting all of the exposed unconnected plates by applying a strip of conductive material thereover, applying leads for connection of said plates and rectifier means to a source of current and to a load, and encapsulating the whole in a unitary insulative housing.

3. The method according to claim 2 in which said multiplier is encapsulated within a high dielectric plastic material.

4. The method according to claim 2 in which said capacative plates are applied to the dielectric substrates by the steps of silk-screening a thin film of metallic paint.

5. The method according to claim 3 including the step of applying an adhesive buttering agent to the contacting metallic elements.

6. The method according to claim 3 in which said capacative plates are applied first to one side of said dielectric substrate and then to the other side of said substrate and thereafter dried and hardened.

7. The method according to claim 2 including the step of covering the exposed plates with a dielectric substrate having deposited a selected number of conductive plates on each side thereof, said covering substrate being oriented so that the plates on one side are contiguous with said exposed plates and thereafter connecting the conductive material to plates of the other side, thereby increasing the voltage capacity of the condenser unit to which said substrate is connected.

References Cited

UNITED STATES PATENTS

| | | | |
|---|---|---|---|
| 1,255,597 | 2/1918 | Giles | 29—25.42X |
| 2,978,789 | 4/1961 | Randels | 29—25.42 |
| 3,187,242 | 6/1965 | Schick | 317—261 |
| 3,238,429 | 3/1966 | Bornhorst | 317—261 |
| 3,229,173 | 1/1966 | McHugh | 317—261X |
| 3,290,756 | 12/1966 | Dreyer | 29—626 |

JOHN F. CAMPBELL, Primary Examiner

R. W. CHURCH, Assistant Examiner

U.S. Cl. X.R.

29—25.42R, 25.41R, 626R, 627R; 174—68.5R; 317—101R, 261R; 307—7R, 110R